United States Patent [19]

Chen

[11] 4,032,905
[45] June 28, 1977

[54] BUBBLE DOMAIN CIRCUIT ORGANIZATION

[75] Inventor: Thomas T. Chen, Yorba Linda, Calif.

[73] Assignee: Rockwell International Corporation, El Segundo, Calif.

[22] Filed: Sept. 18, 1975

[21] Appl. No.: 614,401

[52] U.S. Cl. .................................... 340/174 TF
[51] Int. Cl.² ................................. G11C 11/02
[58] Field of Search ............... 340/174 CL, 174 TF

[56] References Cited
UNITED STATES PATENTS 3,890,605  6/1975  Sionczewski ............... 340/174 CL

*Primary Examiner*—Thomas B. Habecker
*Attorney, Agent, or Firm*—H. Fredrick Hamann; G. Donald Weber, Jr.; Roland G. Rubalcava

[57] ABSTRACT

An on-chip bubble domain circuit organization. One or more storage registers are connected to a propagation path whereby data in the form of magnetic bubble domains (bubbles) may be transferred into and out of the storage registers. The propagation path includes a generator for producing the initial bubbles which are expanded into any desired number of new bubbles by a unique multiple output replicator. A unique input decoder is utilized to determine to which storage register the bubbles from the replicator will be directed along the propagation path. Those bubbles not selected may be annihilated.

An output decoder utilizing essentially the same decoding scheme as the input decoder, selectively receives bubbles from the storage register. A transfer and replicate switch is utilized between the storage register and output decoder to selectively transfer bubbles to the output decoder. The output decoder may collapse all of the bubbles from certain storage registers so that only the information from the selected storage register reaches the detector. The detectors in turn produce the chip output signal. External control electronics are utilized to control the selective operation of the various devices utilized in the propagation path.

22 Claims, 4 Drawing Figures

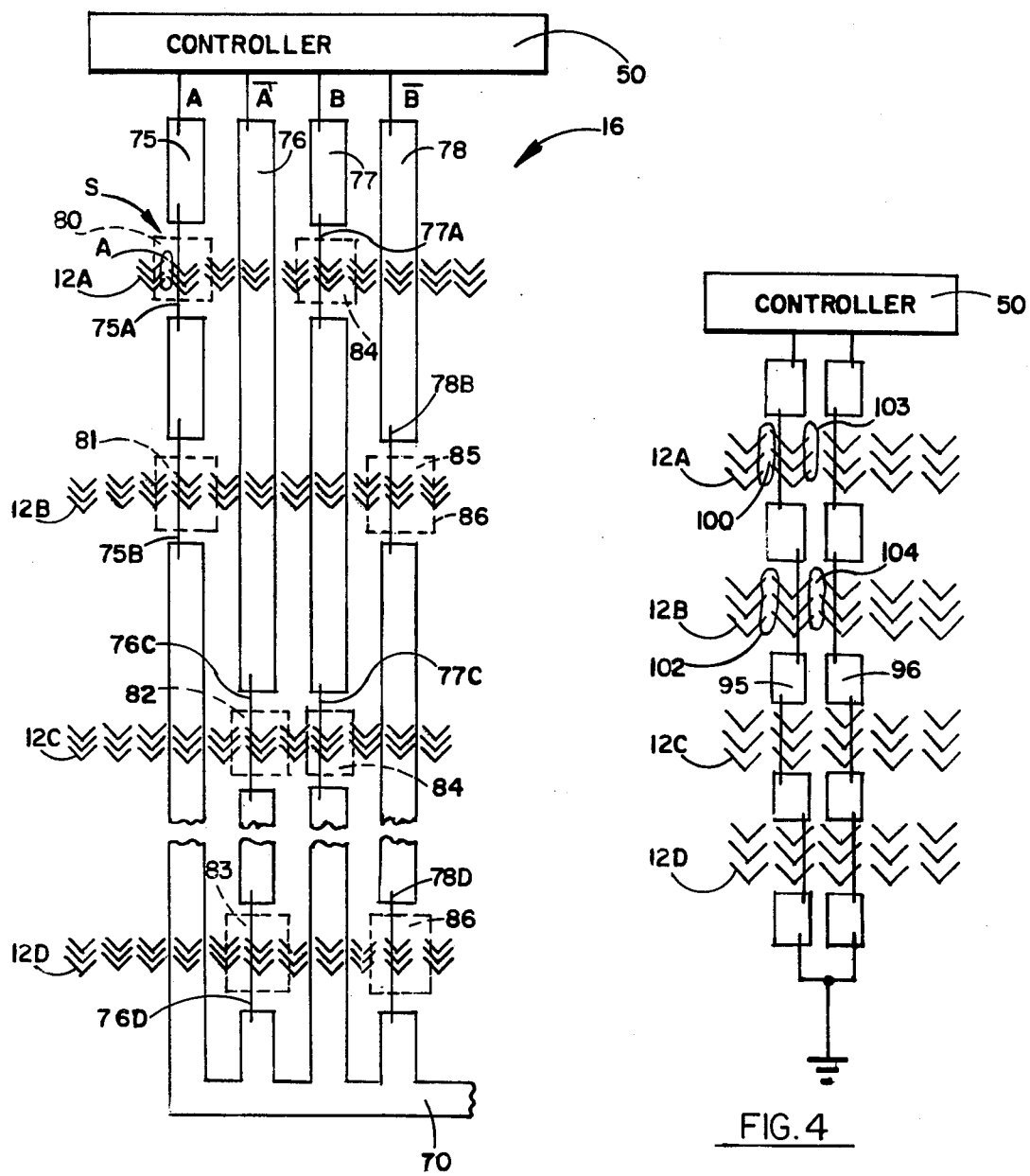

BUBBLE DOMAIN CIRCUIT ORGANIZATION

The invention described herein was made in the performance of work under NASA Contract No. NAS 1-12435 and is subject to the provisions of Section 305 of the National Aeronautics and Space Act of 1958 (72 Stat. 435; 42 U.S.C. 2457).

BACKGROUND OF THE INVENTION

1. Field of the Invention

This invention relates to a magnetic bubble domain chip and, more particularly, to a chip organization utilizing a unique multiple output replicator and unique annihilator-type input/output decoder.

2. Description of the Prior Art

In the prior art, bubble domains are produced by suitable generators. Typically, in an information storage application, each storage register is associated with a separate generator. Conventional bubble generators, such as current loop generators, require relatively large currents to nucleate bubbles. Therefore, it is highly desirable to reduce the number of generators in a bubble domain chip organization.

The on-chip decoding organization approach has been found to enjoy an advantage of faster access time over other systems such as the serial or major-minor loop organization. The slower access time of known systems is normally attributed to designs that require all blocks of information to be arranged in series, thus, requiring the blocks to be rotated, in sequence, to the input/output port. The known systems generally also require read data to be recycled back into the minor loops which lengthens and further complicates the read operation.

In known organizations, all blocks of information are arranged in parallel whereby longer access time and discontinuous data readout can be substantially overcome. However, in the past, the requirement of decoder lines including switches and passive annihilators in the chip designs have been plagued with margin overlap of the decoder switch (transfer type) and the passive bubble annihilator. This problem substantially reduces the effectiveness of the existing decoder organization schemes.

SUMMARY OF THE INVENTION

This invention relates to a magnetic bubble domain chip organization using an improved multiple output replicator and decoder scheme.

An improved multiple output replicator substantially reduces the number of generators required in the chip organization by replicating the bubbles from the generator into any desired number of new bubble domains. The expanding of the bubbles from the multiple replicator is accomplished by utilizing a fast shifting network associated with a passive replicator.

Before the new bubbles reach the respective storage registers, they are decoded by input decoder lines which destroy all bubbles except the selected stream, instead of shifting or delaying the bubbles. This proposed design assures that the propagation paths will be free of unwanted bubbles which would interfere with the chip operation.

For reading purposes, an output decoder similar to the input decoder is utilized. All bubbles emanating from the respective storage registers are annihilated except those selected. Only the information from the selected storage loop reaches the multiple input detector for sensing purposes.

BRIEF DESCRIPTION OF THE DRAWINGS

FIG. 3 is a diagram illustrating one embodiment of an input/output decoder scheme utilized in this invention.

FIG. 4 is a schematic representation of another embodiment of an input/output decoder scheme utilized in the instant invention.

DETAILED DESCRIPTION OF THE PREFERRED EMBODIMENT

Figure 1:
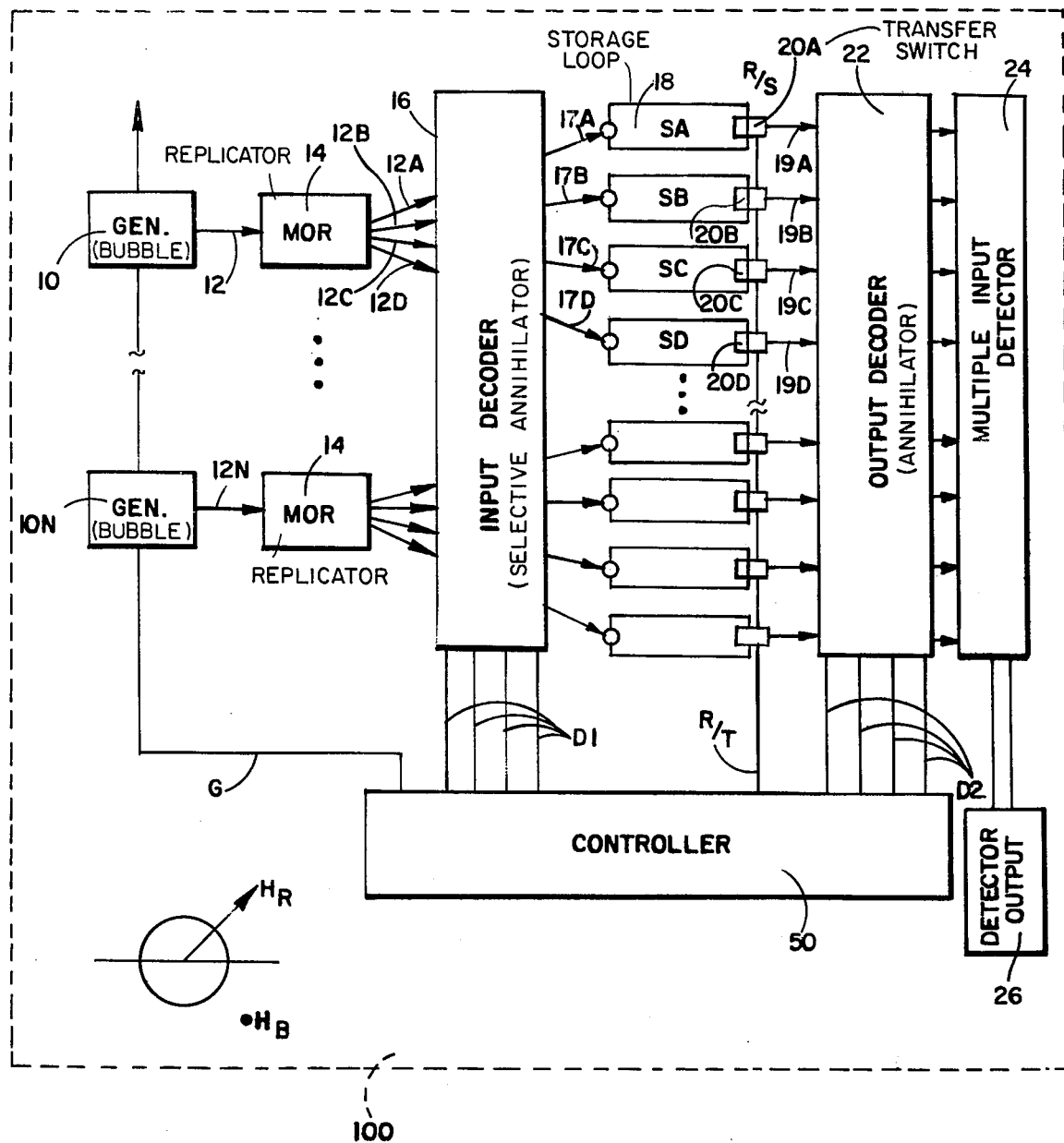
FIG. 1 is a block diagram of the chip organization contemplated by this invention.

Referring to FIG. 1, there is shown, schematically, an illustrative magnetic bubble domain chip organization which provides writing, storing, decoding, clearing and sensing. Chip organization components are formed on magnetic sheet 100 which is fabricated of material suitable for forming bubble domains, such as garnet or orthoferrite. A bias field $H_B$ is applied normal to the plane of the magnetic sheet to produce magnetic bubble domains in sheet 100. In addition, a cyclically rotating field $H_R$, which rotates in the plane of the magnetic sheet 100, is applied in a manner well known in the art to sequentially magnetize the components on sheet 100 to propagate bubble domains in a controlled manner.

External control electronics 50 is any suitable device which is capable of producing the required conductor control current signals. The control electronics are connected to the chip to selectively produce the respective signals on the respective lines emanating therefrom.

A pair of generator devices identified as generators 10 and 10N, respectively, may be utilized. The generators are of any suitable structure known in the art such as a disc or a loop generator. Generator 10 is connected in propagation path 12 and supplies bubbles to multiple output replicator 14 (MOR). Replicator 14, in turn, replicates the bubbles from generator 10 into any desired number of bubbles which are applied to input decoder 16 along suitable propagation paths. Four propagation paths 12A, 12B, 12C and 12D are shown for convenience. The number of propagation paths may be increased or decreased depending upon the number of storage registers 18 in the system. The multiple replication of bubbles, of course, is desirable in that the number of generator devices 10 in the decoder chip is substantially reduced. Ultimately, this reduces the necessity of large quantities of power to nucleate bubbles.

Input decoder 16 is connected to input paths 12A-12D. Input decoder 16 is an annihilator type decoder (as described infra) consisting of decoder lines which control the propagation of bubbles from paths 12A-12D to paths 17A-17D in response to signals D1 from control circuit 50.

Input decoder 16 is also connected to output propagation paths 17A, 17B, 17C and 17D, respectively. In essence, propagation paths 17 may be considered extensions of propagation paths 12. Each propagation path is connected to a respective storage register 18, identified as storage registers SA, SB, SC and SD. Typically, although not so limited, each path 17 is connected to a separate storage register 18 by suitable merge 21 or the like. Each of these registers is a closed loop propagation path which may include a plurality of propagation path elements which are well known in the art.

Typically, all of the bubbles supplied to annihilator 16 via paths 12A to 12D (except one selected path) may be collapsed (annihilated). Thus, information contained in the bubbles (e.g. binary information) is written into a selected storage loop. In a preferred application, the bubbles are annihilated completely so that the propagation path can be simplified and no unwanted bubbles are left in the circuit to interfere with the chip operation.

Switches 20A, 20B, 20C and 20D are connected in series with propagation paths 19A, 19B, 19C and 19D, respectively. Each switch 20 comprises a replicate/-transfer switch which is connected to receive an R/T signal from controller 50. The switches selectively transfer magnetic bubble domains from the respective storage register to the associated propagation paths 19A, 19B, 19C and 19D when energized by the R/T signal. The information on the propagation paths is transferred to decoder 22.

Output decoder 22 is similar to input decoder 18 in that the bubbles emanating from the storage registers may be collapsed in all but one propagation path. The operation of output decoder 22 is controlled by signals D2 from controller 50. Typically, the information in only the selected path from a particular storage loop will reach multiple input detector 24 to produce an output signal. Detector 24 may be of any suitable configuration and may include a single detector or a plurality of smaller detectors connected in series.

A suitable output detector device 26 is connected to detector 24 to produce output signals in accordance with the operation of the detector. In a preferred embodiment, detector 24 may be connected as part of the guard rail that surrounds the systems in some chip structure configurations.

In considering the operation of the chip, it is assumed that useful information is to be stored in the various storage registers. In order to store information in the respective storage registers, the fields $H_B$ and $H_R$ are applied and controller 50 is made operative. The generator signal G produced by controller 50 is applied to all of the generators 10 through 10N which produce magnetic bubble domains as is known in the art. The magnetic bubble domains are propagated along path 12 to multiple output replicator 14. (For convenience, only a single path is described). Replicator 14 produces (replicates) bubbles along propagation paths 12A through 12D. In response to signals D1 from control circuit 50, input decoder 16 is rendered operative to permit bubbles to propagate along one propagation path, for example path 17C. A different arrangement of signals D1 will permit the propagation of bubbles to propagation path 17B, and so forth. Typically, the signals D1 will cause input decoder 16 to collapse all bubbles on the other propagation paths. Of course, if desirable, bubbles may be propagated along a plurality of propagation paths.

The bubbles from the selected propagation path are then stored in the appropriate storage loop 18. The information in storage loop 18 circulates continuously around the loop in response to rotating field $H_R$.

Each storage loop or register 18 has an associated transfer/replicate switch 20. Each switch 20 is connected, in series with the other transfer/replicate switches, to controller 50. Switches 20 are activated by signal R/T whereby all of the information in the respective storage registers 18 may be replicated out of the storage loop and propagated to the output decoder 22. That is, when switches 20 (A-D) are simultaneously pulsed by the application of the R/T signal from control circuit 50, the information in storage loops 18 is transferred to propagation paths 19 (A-D). Propagation paths 19 (A-D) transfer the bubbles to output decoder 22. Decoder 22, similar to input decoder 16, receives bubbles from the propagation paths 19 (A-D). However, in accordance with the control signals D2 from control circuit 50, only certain bubbles are permitted to propagate to decoder 24 wherein the bubble information is detected and displayed at detector output 26. The unselected bubble information is, in a preferred embodiment, annihilated.

Read-out of information from the storage registers may be accomplished either nondestructively or destructively. In the preferred mode of nondestructive readout (NDRO), switch 20 operates in the replicate mode and the information from the storage loop is replicated. Thus, information is simultaneously propagated to output decoder 22 and, as well, returned to the same storage register.

In the destructive readout (DRO) mode of operation, the domains are cleared from the storage registers via switches 20 which are operated in the transfer mode thereby propagating all bubbles in the storage loops to multiple input detector 24. By properly selecting the singals D2 from controller 50, all of the bubbles are annihilated. The destructive readout can be utilized to effectively clear one or more storage registers for insertion of additional bubble domain information.

Figure 2:
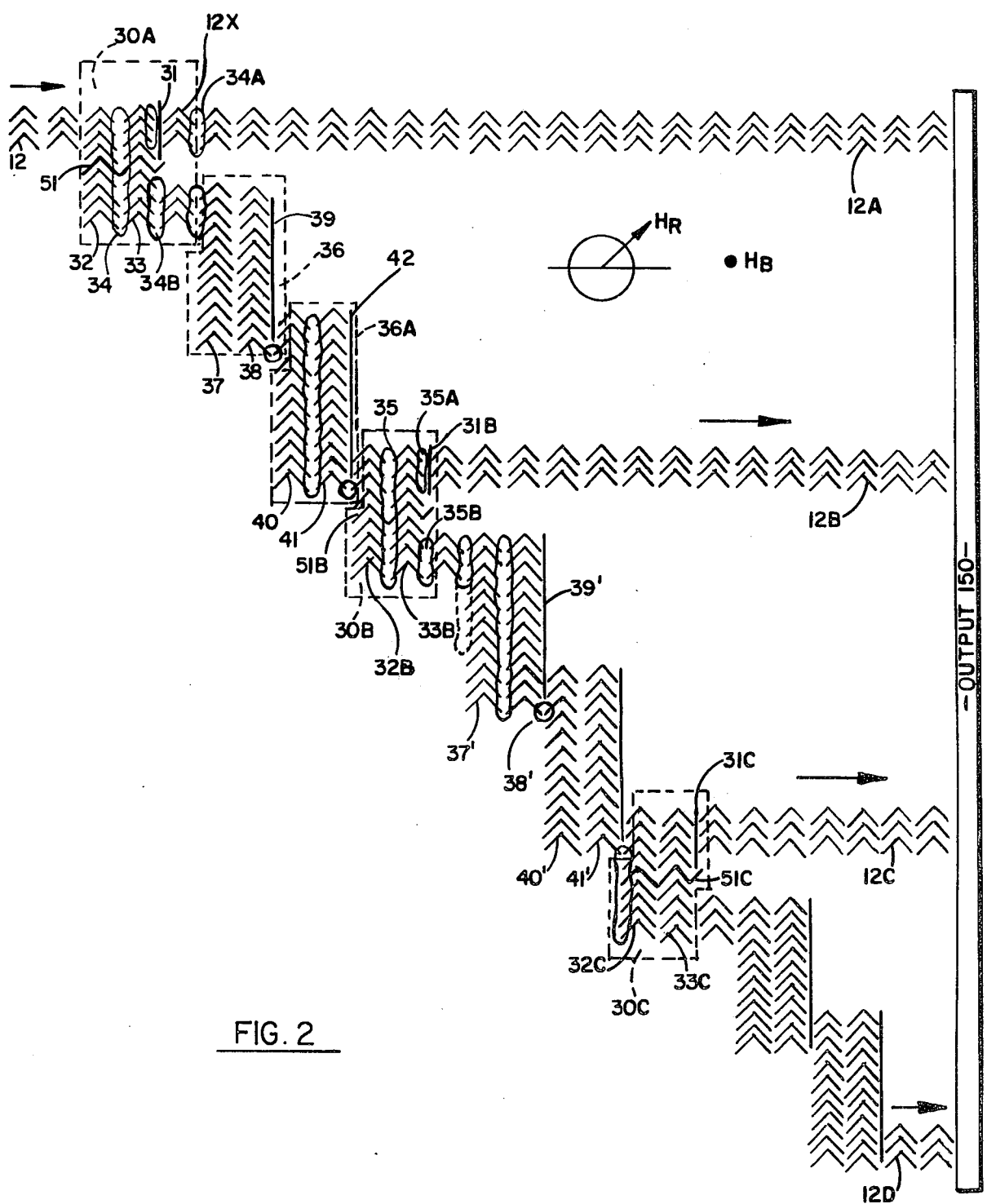
FIG. 2 is a diagram illustrating, in detail, the multiple output replicator utilized in this invention.

Referring now to FIG. 2, there is shown a detailed illustration of a preferred embodiment of multiple output replicator 14 which forms a portion of this invention. Multiple output replicator 14 comprises passive replicators 30A, 30B and 30C which are known in the art and fast shifting networks elements (FSN) 36, 36A, (and others). Passive replicator 30A comprises chevron columns 32 and 33 as well as holder bar 31. Chevron element 51 spans both columns 32 and 33 and, as well, includes a tail portion adjacent to an end of holder bar 51. Element 31 is, typically, located midway between the top and bottom of the chevron columns.

FSN 36 includes chevron columns 37 and 38 as well as pusher bar 39. At least a portion of chevron column 37 overlaps at least a portion of chevron column 33 of replicator 30A, for example the column portion which lies below element 51. FSN 36A comprises chevron columns 40 and 41 as well as pusher bar 42. It should be understood that an FSN can include one or more columns of chevrons. The number of chevrons and columns in FSN 36A and so forth is a function of the operating characteristics of the system including the domain mobility of the material, the device operating frequency, the rotating field magnitude and the like. For example, if the bubble material (e.g. layer 100 of FIG. 1) exhibits relatively low mobility, several columns may be required to expand or relocate the bubble a desired distance. Conversely, if the material supports high mobility, the bubble may expand sufficiently rapidly to require only one chevron column. Thus, the horizontal distance covered by the chevron columns can be equivalent to one or more periods of the rotating field. In the example illustrated, the horizontal distance is equivalent to two periods. In a like manner, the vertical expansion of the bubble is determined by the number of chevrons in a column.

Bubbles entering the replicator, as indicated by the arrow, via propagation path 12 are stretched and split by passive replicator 30A. That is, under the influence of rotating field $H_R$, the bubble at the last chevron column at path 12, expands along the length of column 32 of replicator 30A. As field $H_R$ rotates, the strip bubble (e.g. bubble 34) on chevron column 32 shifts to column 33 of replicator 30A. The bubble continues to move to the right end of chevron column 33. However, the magnetic fields and poles established by element 51 and holding bar 31 cause the strip bubble to split into two portions, i.e. bubbles 34A and 34B. Bubble portion 34A is transferred to propagation path 12A at chevron column 12X. Bubble portion 34B is transferred to FSN 36 at chervon column 37. Bubble 34A continues along propagaton path 12A in the usual manner. Bubble 34B enters the FSN network where it is expanded due to the quantity of chevrons arranged therein. The expanded bubble propagates to the right end of column 38. The bubble is reduced in size due to the strong magnetic pole of pusher bar 39. Typically, the bubble is reduced to a "standard" cylindrical configuration at the lower end of pusher bar 39. As field $H_R$ rotates, this bubble is transferred to column 40 and expanded thereby. The expanded bubble is then transferred to column 41 in the usual manner. The bubble is again reduced by the effect of pusher bar 42.

The bubble then enters passive replicator 30B. Again, bubble domain 35 is stretched and split into two bubbles. Bubble 35A continues along propagation path 12B in the usual manner.

The sequence described above is repeated so that bubbles are rapidly spread along the FSN elements. Also, bubbles are produced by the replicators and directed along propagation paths 12C and 12D in the same manner. The components of the multiple output replicator may be varied to accommodate the designs requiring many propagation paths and to accommodate the varying distance between the propagation path. Moreover, the FSN elements spread the replicated bubbles to any desired position in a relatively short time. Inasmuch as the storage loops are usually relatively widely spaced and conventional passive-replicators alone can only spread a few chevrons away. Bubbles frequently have to be steered toward each storage loop after replication. If conventional propagation paths are utilized, a large number of propagation steps are required. Also different path lengths may be required depending upon the distance between the generator and storage loops. Utilizing this multiple input replicator, bubbles may be shifted along all paths in the same amount of time, thus simplifying the path arrangement.

Referring now to FIG. 3, there is shown one embodiment of an annihilator-type input decoder 16 (or output decoder 22) utilized in this invention. This decoder scheme utilizes a one-level line, annihilator where a permalloy line may directly cross the path comprised of chevron elements connected with a gross aligned conductor overlay. Typically, decoder 16 includes a plurality of decoder lines. In the illustrated embodiment, decoder lines 75–78 are connected to receive signals from controller 50. The decoder lines are returned to a common conductor which is connected to a suitable reference source, for example, ground potential. Each of the decoder lines includes one or more annihilator components shown in dotted outline. Decoder line 75 includes annihilators 80 and 81 located adjacent propagation paths 12A and 12B. Likewise, decoder line 76 includes annihilators 82 and 83 located in line with propagation paths 12C and 12D. Similarly, decoder lines 77 and 78 each have two switches located in line with paths 12A, 12C and paths 12B and 12D, respectively. Typically, decoder lines 75–78 include relatively wide signal conductors and relatively narrow annihilator conductors. The signal conductors are formed of suitable conductive material such as copper, aluminum, gold, chromium or alloys thereof, on the magnetic material to interconnect the annihilator conductors formed of permalloy or the like, over (or as part of) the propagation paths and connected between the spaced ends of the decoder line signal conductors. The annihilator conductor is disposed adjacent to one end of the chevron group of the adjacent propagation path.

The actual propagation path is determined by activating the desired decoder lines with current pulses from controller 50. Inasmuch as decoders 16 and 22 are substantially similar, the information stored in a storage register is affected in terms of transferring and-/or annihilating of selected streams of magntic bubble domains. Thus, the decoder annihilates unselected bubbles instead of shifting or delaying them thereby eliminating all unselected bubbles from interference with the chip operation. To achieve binary operation of the decoder, two complementary annihilator lines are used. The respective annihilator is effected by supplying a current pulse to a decoder line. The current pulse has a polarity which establishes a magnetic field which is opposite to the field of the magnetic domain, which is then collapsed. The relatively wide signal conductor does not produce a field of sufficient intensity at the proper location while the annihilator conductor does. Thus, localized annihilation can be achieved.

In essence, each set of decoder lines has a binary effect. For example, if decoder lines 76 and 78 are activated by controller 50, bubbles entering path 12A propagate through to storage register SA. The bubbles in paths 12B, 12C and 12D are annihilated. The annihilation of bubbles entering path 12B-12D is effected by supplying a current pulse through the respective conductor at the instant when a stripe domain is at position A of annihilator 80. The current polarity through the conductor is selected to generate a negative magnetic field at position A of annihilators 80 and 81, which collapses the stripe domain. If decoder lines 76 and 77 are activated, bubbles entering paths 12A, 12C and 12D are annihilated; bubbles entering path 12B continue on. Likewise, when decoder lines 75 and 78 are actuated, bubbles on paths 12A, 12B and 12D are annihilated while bubbles on path 12C continue on. Other lines and paths can be added to the system to perform additional functions. It can be seen that sets of decoder (annihilator) lines can be utilized to achieve a binary function of an input decoder thereby transferring the desired information in the respective propagation path of the selected storage register. The unselected bubbles are not steered or repelled but are annihilated so that unselected bubbles may not contaminate the propagation paths.

Referring now to FIG. 4, there is shown another embodiment of the decoder element which may be used as input decoder 16 or output decoder 22. As in the preceding figures, the propagation paths 12A, 12B, 12C and 12D are shown. These propagation paths comprise the typical chevron columns. In this embodiment, decoder lines 95 and 96 also include wide signal conductors connected to controller 50 to receive the signals A and B, respectively. The other end of conductor lines 95 and 96 are connected together to a common reference point, for example ground potential. Typically, decoder lines 95 and 96 include offset portions of the thin permalloy annihilator conductors. The offset portions are adjacent (e.g. overlay) ends of chevron columns as shown in FIG. 4.

In this embodiment, controller 50 has the ability to produce signals which are bipolar. Thus, signal A represents, for example, a positive pulse (such as a current pulse) from controller 50 to the common conductor. Conversely, the signal $\bar{A}$ represents a negative going signal, or current pulse, from the common connector towards controller 50. In other words, signals A and $\bar{A}$ represents currents of opposite direction in conductors 95. Likewise, oppositely directed or bipolar signals B and $\bar{B}$ can be generated in conductor 96.

As noted, annihilators 95 and 96 are conductors which are offset from each other relative to the signal conductors and the propagation paths. The offset portions thus establish magnetic fields (when pulsed) adjacent specified ends of chevron columns. Depending upon the current direction and the end of the chevron column to which the conductor is adjacent, bubbles may be selectively annihilated. For example, bubble domain 100 is adjacent the left end of the chevron in a chevron column in propagation path 12A. The application of a positive current pulse A through path 95 at the instant bubble 100 reaches the left end of chevron elements produces a magnetic field which is opposite to the magnetic field of domain 100. Consequently, this domain will be selectively annihilated, but bubble 102 along path 12B will not be annihilated because the magnetic field generated by conductor line 95 adjacent bubble 102 is too distant to effect bubble 102. If a negative pulse $\bar{A}$ is applied to conductor 95 at the instant bubble 104 reaches the left end of the chevron element, a negative field is generated for bubble 104, hence it will be annihilated. Conversely, bubble 103 will not be effected because the magnetic field generated by conductor 95 adjacent bubble 103 is too distant to impact it. Thus, by controlling the polarity and the timing of the pulse, a binary annihilating effect can be achieved.

Similar operations will occur as a result of the application of signals B or $\bar{B}$ to conductor 96. Additional conductors, signals or propagation paths can all be added to the decoder configuration. Thus, by suitable selection of the signals applied to the conductor by the controller, propagation along one more propagation paths can be effected.

It is to be understood that a desired change in the coding of the signals applied to any of the described decoders can result in information being stored in any storage register. While the previously filled storage register will remain unaffected during this operation, this operation continues until tthe storage registers are filled with the desired information. Depending upon the design, the number of sets of annihilating lines will vary.

Thus, there is shown and described a preferred embodiment of an on-chip decoding circuit organization. In this organization, the bubble domains produced by the generator are in turn replicated into new bubble domains and rapidly supplied to any number of propagation paths utilized in the organization. A significant advantage of this chip organization is the reduction in number of generators required thereby substantially reducing the necessity of large quantities of power to nucleate bubbles. Any interchangeable devices, components or elements may be utilized in this organization without departing from the invention concept. Thus, this scheme is not dependent upon specific components, elements or devices. Moreover, it may be understood that this chip organization can be achieved with so-called two-level, one and one half level or even one level processing with appropriate choice of components and configuration. This description is intended to be illustrative only and not limitative. The scope of this invention is intended to be limited only by the claims appended hereto.

Having thus described a preferred embodiment of the invention, what is claimed is:

1. A device for magnetic bubble domains comprising:
   a magnetic sheet having propagation paths in which said domains can be propagated;
   generator means for selectively producing said domains;
   replicator means for splitting said domains from said generator means into a plurality of new domains which are applied to different propagation paths;
   storage means for storing said domains;
   input decoder means for selectively transferring said new domains from said replicator means to said storage register means;
   detector means for detecting said domains;
   switch means associated with said storage means for selectively transferring said domains from said storage means and said detector means; and
   output decoder means for selectively transferring said domains from said switch means to said detector means.

2. The device recited in claim 1 wherein said storage means comprises a propagation path loop for recirculating domains.

3. The device recited in claim 1 including means for applying magnetic fields thereto to support and move said magnetic bubble domains.

4. The device recited in claim 13 wherein said shifting means includes at least one column of chevrons for expanding domains from said replicator means, and
   pusher bar means for selectively restricting the size of an expanded domain.

5. The device recited in claim 1 wherein said storage means comprises a plurality of separate storage loops, and
   said switch means comprises a plurality of switches connected in series for simultaneous operation,
   each of said switches associated with a separate respective storage loop.

6. The device recited in claim 1 wherein said input decoder means includes at least one conductor disposed adjacent said magnetic sheet and crossing said propagation paths, said conductor including at least one portion thereof adapted to apply a magnetic field to selectively annihilate magnetic bubble domains in said magnetic sheet in proximity to said one portion.

7. The device recited in claim 1 including:
   control means for supplying control signals to the generator means, switch means, input decoder means and output decoder means in order to selectively activate same.

8. The device recited in claim 1 wherein said generator means, said replicator means, said input decoder means, said output decoder means and said switch means are coupled together by a common propagation path for transferring said bubble domains.

9. The device recited in claim 7 wherein said conductor includes portions thereof which are offset relative to each other so as to concurrently apply a magnetic field to different portions of said propagation paths whereby magnetic bubble domains are annihilated in only some portions of said propagation path and in other portions of said propagation path said magnetic field does not effect the propagation path of said magnetic bubble domains.

10. The device recited in claim 4 wherein the distance covered by said chevron column in said shifting means can be traversed by said magnetic bubbles within one period of the rotating field.

11. The device recited in claim 6 wherein each of said portions of said conductor is relatively narrower than the remainder of said conductor.

12. A device for magnetic bubble domains comprising:
- a magnetic sheet having propagation paths in which said domains can be propagated;
- storage means for storing said domains;
- generator means for selectively producing said domains;
- replicator means for selecting said domains from said generator means for splitting said domains into a plurality of new domains;
- shifting means for diverting said new magnetic domains to any desired propagation path;
- said shifting means comprises at least one column of chevrons and pusher bar means;
- input decoder means for selectively transferring said new domains from said shifting means to said storage register means;
- detector means for detecting said domains; and
- output decoder means for selectively transferring said domains to said detector means;
- switch means associated with storage mean for selectively transferring said domains between said storage means and output decoder means.

13. The device recited in claim 1 including:
shifting means adapted to receive said new domains from said replicator means and operative to divert said new domains to any desired propagation path.

14. The device recited in claim 1 wherein said propagation paths comprise a plurality of columns of chevron elements.

15. The device recited in claim 1 wherein
said replicator means is a passive replicator and comprises at least two adjacent columns of chevron elements;
propagation path portions coupled to one of said adjacent columns to supply domains thereto from said generator means, and
further propagation path portions coupled to the other of said adjacent columns to receive said plurality of new domains therefrom.

16. The device recited in claim 1 wherein
said replicator means comprises a plurality of passive replicator means;
shifting means interconnecting said plurality of passive replicator means such that at least one of said new domains produced by each of said passive replicator means is transferred to another of said passive replicator means for operation thereon.

17. The device recited in claim 5 wherein
each of said plurality of switches is an active switch;
said plurality of switches connected in series by a control signal conducting means.

18. The device recited in claim 1 wherein
each of said domains produced by said generator means is substantially uniform;
said propagation paths cause said domains to propagate therealong in a relatively uniform manner in response to a control magnetic field.

19. The device recited in claim 6 wherein
said output decoder means is of similar configuration to said input decoder means.

20. The device recited in claim 4 wherein
said pusher bar means is substantially as long as said column of chevrons such that the restricted domain is nearly circular in configuration.

21. The device recited in claim 8 including
shifting means connected between said replicator means and said input decoder means to form a portion of an additional common propagation path.

22. The device recited in claim 1 wherein
each of said input decoder means and said output decoder means includes at least two conductors disposed adjacent said magnetic sheet and crossing said propagation paths;
each of said two conductors including at least one portion thereof adapted to apply a magnetic field to selectively annihilate domains in said magnetic sheet, in proximity to said one portion;
said one portion in each of said two conductors disposed adjacent a different propagation path.

* * * * *